United States Patent [19]
Dalla Libera et al.

[11] Patent Number: 5,985,718
[45] Date of Patent: Nov. 16, 1999

[54] PROCESS FOR FABRICATING MEMORY CELLS WITH TWO LEVELS OF POLYSILICON FOR DEVICES OF EEPROM TYPE

[75] Inventors: Giovanna Dalla Libera, Monza; Bruno Vajana, Bergamo; Roberta Bottini, Lissone; Carlo Cremonesi, Vaprio D'Adda, all of Italy

[73] Assignee: SGS-Thomson Microelectronics S.r.l., Agrate Brianza, Italy

[21] Appl. No.: 08/996,922

[22] Filed: Dec. 23, 1997

[30]    Foreign Application Priority Data

Dec. 24, 1996  [IT]  Italy .................................. MI96A2742

[51] Int. Cl.[6] .............................................. H01L 21/8247
[52] U.S. Cl. ........................................... 438/264; 438/290
[58] Field of Search .................................... 438/257–267, 438/289, 290

[56]                 References Cited

U.S. PATENT DOCUMENTS 5,607,868   3/1997   Chida et al. .
5,702,957  12/1997   Padmanabhan .
5,705,416   1/1998   Kim et al. .
5,789,295   8/1998   Liu ......................................... 438/264
5,877,054   3/1999   Yamauchi .............................. 438/264

*Primary Examiner*—Richard Booth
*Attorney, Agent, or Firm*—Jenkens & Gilchrist

[57]                 ABSTRACT

A process for fabricating a memory cell having two levels of polysilicon and being included in a memory device of the EEPROM type, wherein the device is formed on a semiconductor material substrate which has a first conductivity type. The process comprises the steps of forming, on the substrate a thin tunnel oxide region surrounded by a gate oxide region previously formed on the same substrate, depositing a layer of polycrystalline silicon over the gate oxide region and the thin tunnel oxide region, and successively depositing a composite ONO layer and an additional polysilicon layer over the polycrystalline silicon layer. A capacitive implant mask having a window is formed by depositing a layer of a light-sensitive material over the additional polysilicon layer, a dopant is implanted through the window at an energy and with dosages effective to penetrate the polycrystalline silicon, ONO, and polysilicon layers, respectively, and a region of electric continuity is formed laterally and beneath the thin tunnel oxide region.

5 Claims, 4 Drawing Sheets

PROCESS FOR FABRICATING MEMORY CELLS WITH TWO LEVELS OF POLYSILICON FOR DEVICES OF EEPROM TYPE

FIELD OF THE INVENTION

This invention relates to a CMOS type of process for fabricating memory cells having two levels of polysilicon and intended for EEPROM devices, in particular devices of the FLOTOX EEPROM type.

BACKGROUND OF THE INVENTION

As is known, there exists a demand from the market for EEPROM memory devices of ever larger capacity (>256 Kb), which implies a demand for physically ever smaller memory cells and hence increased difficulty in fabricating such cells.

Memory devices of the FLOTOX EEPROM type are presently the most widely employed memory devices by major manufacturers throughout the world. These devices are formed of floatinggate memory cells with two levels of polysilicon, wherein an electric charge is stored to establish two different cell states, "written or "erased," which correspond to the logic states of "1" or "0", respectively.

More particularly, FIGS. 1 and 2 show the details of a FLOTOX EEPROM type of memory cell, indicated at 1, which is included in a memory device 2, itself formed on a semiconductor material substrate 10 having a first conductivity type, specifically of the P type. The device 2 further comprises a select transistor 3 connected in series with the cell 1.

Referring now to FIG. 1, it can be seen that the substrate 10 includes a source region 11 of the cell 1 which has a second conductivity type, specifically of the N type, and a region 12 of electric continuity having the same conductivity type. This substrate also includes a drain region 13 of the cell 1 and a source region of the transistor 3 (the drain/source region 13) having the second conductivity type, specifically of the N type. All the regions indicated at 11–14 are facing a surface 15 of the substrate 10.

With further reference to FIG. 1, in stacked arrangement above the surface 15 are the following: a gate oxide region 18 of the cell 1, at the sides whereof are the source 11 and drain 13 regions of the cell, the region 18 having a thin tunnel oxide region 19 formed therein, a first portion 20 of a first polycrystalline silicon (poly1) layer, a first portion 21 of a dielectric (interpoly) layer, and a first portion 22 of a second (poly2) layer comprised of polycrystalline silicon and tungsten silicide. The portions 20 and 22 form the floating gate region and control gate region, respectively, of the cell 1.

A portion of the substrate 10, indicated at 31 in FIG. 1, is included between the region 12 of electric continuity and the source region 11 of the cell 1 to form the cell channel region having a length dimension denoted by L.

It should be noted that the thin tunnel oxide region 19, provided thinner (approximately 80 Å thick) than the gate oxide region 18, is adapted to pass electric charges to the floating gate region by tunnel effect (a phenomenon also known as Fowler-Nordheim current), i.e., for programming the cell 1.

The region 12 of electric continuity, formed laterally and beneath the thin tunnel oxide region 19 and partly overlapping the drain region 13 of the cell 1, provides electric continuity between a portion of the substrate 10 underlying the region 19 (the so-called tunnel area) and the drain region 13.

With continued reference to FIG. 1, stacked on top of one another above the surface 15 are: a gate oxide region 25 of the select transistor 3, at the sides whereof there extend the source 13 and drain 14 transistor regions, a second portion 26 of poly1, a second portion 27 of the dielectric (interpoly) layer, and a second portion 28 of poly2. The portions 26 and 28 of the polycrystalline silicon layer are shortcircuited to a field oxide region, not shown in the drawings, outside the cell 1. An intermediate oxide layer 30 covers the device 2 and isolates the various layers from one another.

As can be seen in FIG. 2, the floating gate region, portion 20 of poly1, of the cell 1 is insulated and enclosed at the top and the sides by the dielectric interpoly layer 21, preferably an ONO layer formed of a superposition of silicon Oxide-silicon Nitride-silicon Oxide, and at the bottom by the gate oxide 18 and tunnel oxide 19 regions.

Still with reference to FIG. 2, the region 12 of electric continuity and the channel region 31 (shown in FIG. 1) are bounded, laterally along their widths, by a thick field oxide layer 32.

Shown in FIG. 3 are the masks employed to form the memory cell 1. In detail, the reference numeral 4 denotes a capacitive implant mask for forming the region 12 of electric continuity, and the reference numeral 5 denotes a tunnel mask for forming the region 19.

Further in FIG. 3, the reference numeral 6 denotes a self-aligned etching mask (to be explained hereinafter), and the reference numeral 7 denotes a drain/source implant mask for forming the drain/source region 13. Finally, the reference numeral 8 denotes a mask for making the drain contact D for the select transistor 3.

The process for fabricating the memory cell 1 is a typical (two- or single-well) CMOS process.

Referring first to FIG. 4, and starting from the substrate 10, the capacitive implant mask 4 is formed after growing the field oxide 32, not shown in the Figure, to bound the active areas of the device 2 and grow a sacrifical oxide layer 39. This mask is formed using a layer 40 of a light-sensitive material fully covering the sacrificial oxide layer 39 but for a window 41 through which the capacitive implantation (usually phosphorus for N-channel cells) will be effected to form the region 12 of electric continuity, as shown in FIG. 5.

Referring now to FIG. 5, after removing the mask 4 and sacrificial oxide layer 39, a gate oxide layer 42 is grown to form the gate oxide region 18 of the cell 1. The tunnel mask 5 is then deposited which comprises a layer 43 of a light-sensitive material fully covering the gate oxide layer 42 but for a window 45 where the thin tunnel oxide region 19 is to be formed.

Thereafter, a dedicated etching is applied to cleanse the surface 15, which results in the exposed portion of the layer 42 being etched away and the intermediate structure shown in FIG. 5 being produced.

Referring to FIG. 6, the thin tunnel oxide region 19 surrounded by the gate oxide layer 42 is grown using the tunnel mask 5. The tunnel mask 5 is then removed to provide the intermediate pattern shown in FIG. 6. This is followed by the steps of:

depositing and doping the first (poly) layer 44 of polycrystalline silicon, as shown in FIG. 7;

shaping layer 44 to delimit the width (along the horizontal direction in FIGS. 2 and 3) of the floating gate region 20 for the cell 1;

depositing the composite ONO (dielectric interpoly 21) layer, and an additional polysilicon layer, the so-called "mini-poly," not shown in FIGS. 1 and 2, since a thermal treatment will integrate it to the second (poly2) layer of polycrystalline silicon yet to be deposited;

back-etching the additional polysilicon layer and the ONO layer 21 in the circuitry area of the device 2;

depositing and doping the poly2 layer;

self-alignment etching the poly2, mini-poly, ONO, poly1, and gate oxide 42 layers in the matrix, using the mask 6 to delimit the length (along the vertical direction in FIG. 3) of the floating gate 20 and control gate 22 regions of the cell 1 and simultaneously back-etching the poly2 and poly1 layers in the circuitry area to define the gates of transistors comprising the circuitry;

growing a protecting oxide layer (not shown because embedded within the dielectric layer 30) over the control gate region 22;

optionally effecting a first light drain/source implantation;

forming oxide portions, or spacers, not shown in the drawings, laterally of the floating gate 20 and control gate 22 regions; and effecting a drain/source implantation using the mask 7, to produce the regions 11, 13 and 14, and therefore, the structure shown in FIGS. 1 and 2.

Subsequently, the following conventional final steps are carried out:

forming the intermediate dielectric layer 30 and the contacts, and defining the metal; and depositing the passivation layer.

What is needed is to provide a CMOS process for fabricating memory cells of the FLOTOX EEPROM type with improved potential for scaling.

SUMMARY OF THE INVENTION

Accordingly, set forth is a process for fabricating a memory cell having two levels of polysilicon and being included in a memory device of the EEPROM type, the device being formed on a semiconductor material substrate with a first conductivity type. The process comprises the steps of forming, on the substrate a thin tunnel oxide region surrounded by a gate oxide region previously formed on the same substrate, depositing a layer of polycrystalline silicon over the gate oxide region and the thin tunnel oxide region, successively depositing a composite ONO layer and an additional polysilicon layer over the polycrystalline silicon layer, forming a capacitive implant mask having a window by depositing a layer of a light-sensitive material over the additional polysilicon layer, implanting a dopant through the window at an energy and dosages effective to penetrate the polycrystalline silicon, ONO, and polysilicon layers, respectively, and forming a region of electric continuity laterally and beneath the thin tunnel oxide region.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of the process according to the invention will be apparent from the following description of an embodiment thereof, given by way of non-limitative example with reference to the accompanying drawings.

In the drawings.

DETAILED DESCRIPTION OF A PREFERRED EMBODIMENT OF THE INVENTION

Figure 2:
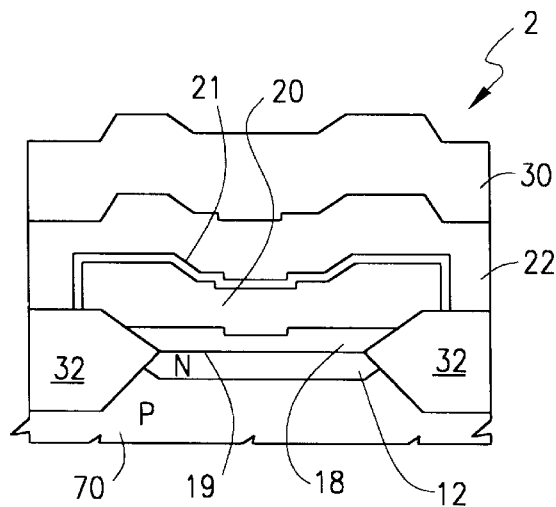
FIG. 2 is another cross-section through the memory device of FIG. 1.
Figure 1:
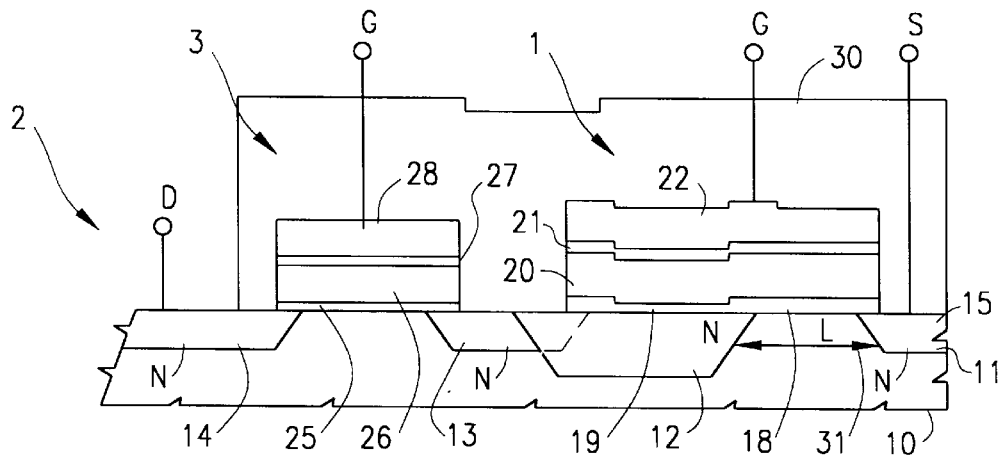
FIG. 1 is a cross-section through a device including the prior art memory cell.
Figure 3:
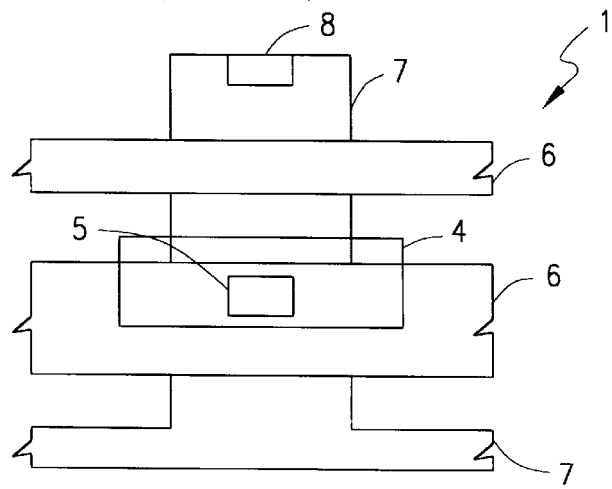
FIG. 3 is a plan view of certain masks used in fabricating an EEPROM cell according to the prior art.
Figure 4:
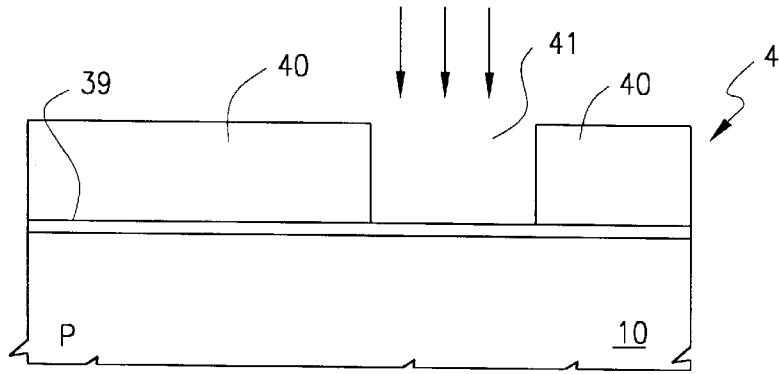
FIGS. 4–7 are cross-sectional views, similar to FIG. 1, of the prior art memory cell at different stages of its fabrication process.
Figure 5:
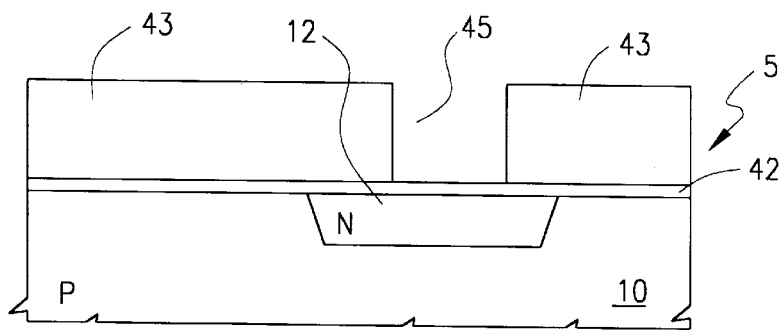
Figure 6:
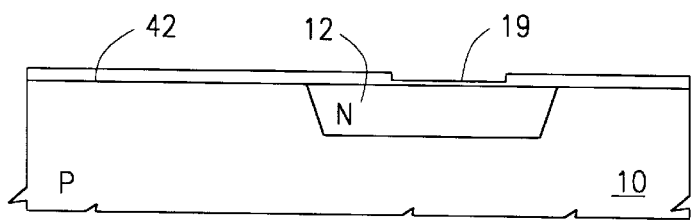
Figure 7:
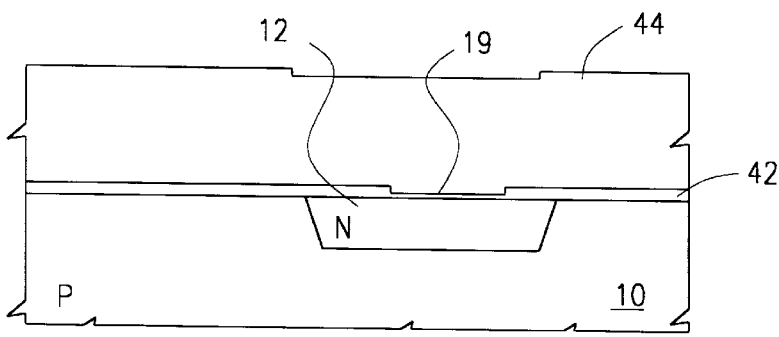

In general, the process of the present invention improves upon the prior art processes described in connection with FIGS. 1–8 by carrying out the capacitive implantation after depositing the ONO and "mini-poly" layers rather than before growing the gate and tunnel oxides. In this way, the capacitive implantation involves less thermal treatments at high temperatures, so that the region of electric continuity will diffuse into the substrate to a lesser extent. As a result, the length of the cell channel region is increased to enhance the potential for scaling of the cell.

Referring to FIGS. 8–13, a process for fabricating a memory cell included within a memory device of the FLOTOX EEPROM type according to the present invention begins with the growing—over a semiconductor material substrate 50 having a first type of conductivity, specifically of the P type—a field oxide, not shown in the drawing Figures, to delimit the active areas of the device.

Figure 8:
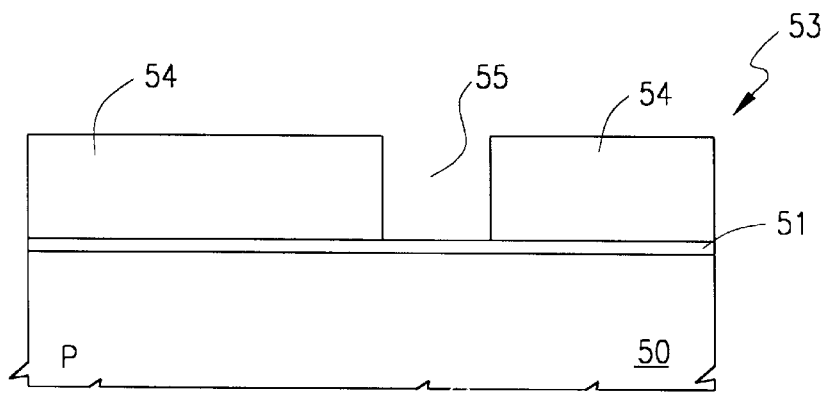
FIGS. 8–13 are cross-sectional views, similar to FIG. 1, of a memory cell according to the present invention at different stages of its fabrication process.
Figure 10:
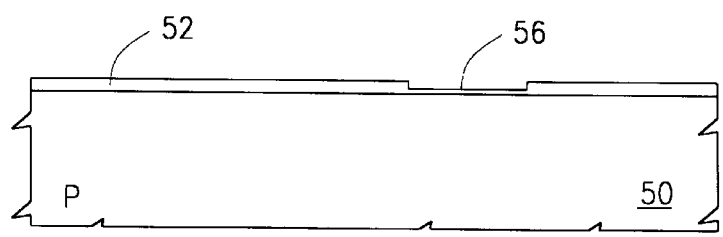

Referring to FIG. 8, a gate oxide layer 51 is then grown to produce a gate oxide region 52, as shown in FIG. 10. Subsequently, a tunnel mask 53 is deposited which is formed of a layer 54 of a light-sensitive material and completely covers the gate oxide layer 51 but for a window 55 where a thin tunnel oxide region 56 will be formed.

Figure 9:
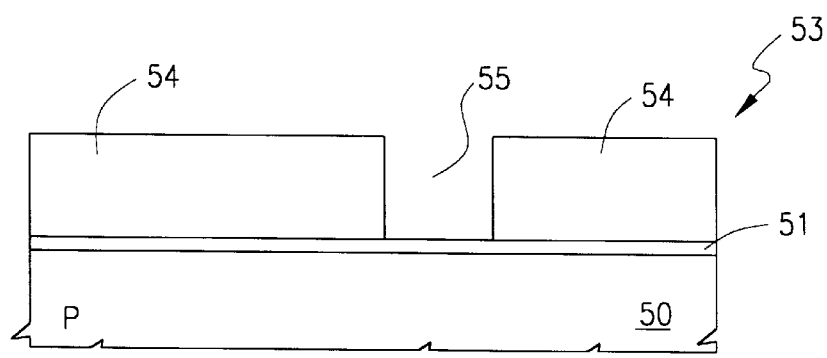

A dedicated etching step is then carried out to clean a portion of the substrate 50 surface, which results in the exposed portion of the layer 51 being removed and the intermediate structure shown in FIG. 9 produced.

Figure 11:
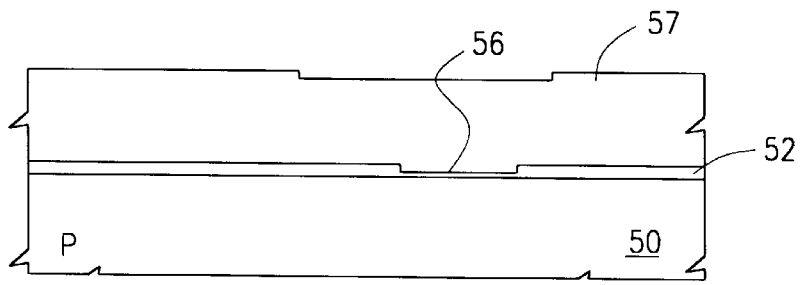
Figure 12:
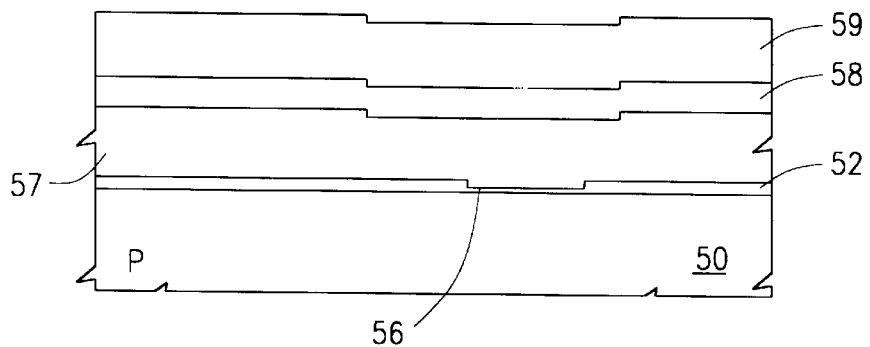
Figure 13:
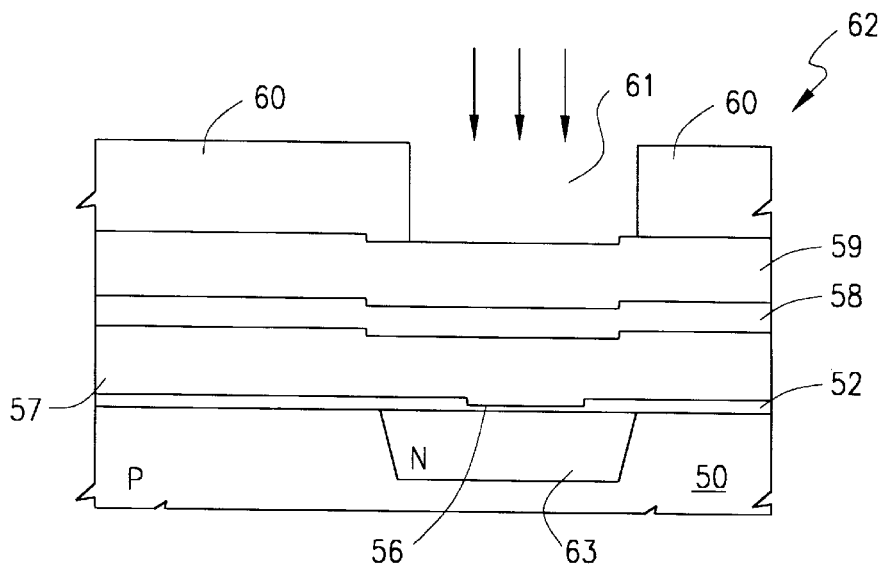

Referring now to FIG. 10, the thin tunnel oxide region 56 surrounded by the gate oxide region 52 is grown using the tunnel mask 53. Thereafter, the tunnel mask 53 is removed to produce the intermediate pattern shown in FIG. 10. This is followed by the steps of:

depositing, doping, and shaping a first (poly1) layer 57 of polycryatalline silicon, as shown in FIG. 11;

depositing a composite (dielectric interpoly) layer 58 of ONO and an additional polysilicon layer 59, the so-called "mini-poly," as shown in FIG. 12;

depositing a layer 60 of a light-sensitive material to completely cover the additional polysilicon layer 59 but for a window 61, thereby producing a capacitive implant mask 62 as shown in FIG. 13; and implanting in a dedicated manner a dopant having the second conductivity type, specifically of the N type, through the window 61 at an energy (above 250 KeV) and dosages (around $5 \times 10^{14}$ ions/$CM^2$) adequate to permit penetration of the poly1, ONO and "mini-poly" layers to form a region 63 of electric continuity beneath and laterally of the thin tunnel oxide layer 56, as shown in FIG. 13.

In general, the dopant would be phosphorus for N-channel cells.

After removing the mask 62, the structure Of FIG. 13 will be subjected to conventional successive operations for forming the floating gate, control gate, source, and drain regions of the memory cell.

It should be noted that, by applying the capacitive implantation—necessary to the operation of FLOTOX EEPROM cells—after forming the ONO layer and depositing the "mini-poly," the implantation can undergo less thermal treatments at high temperatures and, accordingly, develop reduced diffusion.

In particular, the implanted dopant is subjected to none of the thermal treatments required for forming the oxides and layers which comprise the ONO and, accordingly, will not diffuse too deeply in the substrate.

The reduced diffusion of implanted dopant allows the cell size to be scaled, since the channel length of the cell is reduced without affecting the cell performance. The activation of the implanted dopant is ensured by the successive thermal treatments applied to activate the dopants employed in the formation of the cell drain and source regions.

In summary, by carrying out the capacitive implantation after the formation of the ONO layer and the deposition of the "mini-poly," improved potential for scaling can be provided for the memory cell without adding or modifying any of the standard process masks.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A process for fabricating a memory cell having two levels of polysilicon and being included in a memory device of the EEPROM type, said device being formed on a semiconductor material substrate with a first conductivity type, said process comprising the following steps:

forming, on the substrate a thin tunnel oxide region surrounded by a gate oxide region previously formed on the same substrate;

depositing a layer of polycrystalline silicon over the gate oxide region and the thin tunnel oxide region;

successively depositing a composite ONO layer and an additional polysilicon layer over the polycrystalline silicon layer;

forming a capacitive implant mask having a window by depositing a layer of a light-sensitive material over the additional polysilicon layer;

implanting a dopant through the window at an energy and dosage effective to penetrate the polycrystalline silicon, ONO, and polysilicon layers, respectively; and forming a region of electric-continuity laterally and beneath the thin tunnel oxide region.

2. The process according to claim 1, wherein the implanted dopant has a second conductivity type.

3. The process according to claim 2, wherein the implanted dopant is phosphorus.

4. The process according to claim 1, wherein the implantation step is carried out at a higher energy than 250 Kev.

5. The process according to claim 1, wherein the dopant is implanted with a dosage of about $5 \times 10^{14}$ ions/cm$^2$.

* * * * *